(12) United States Patent
Samper et al.

(10) Patent No.: US 9,952,634 B2
(45) Date of Patent: Apr. 24, 2018

(54) INTERFACING WITH MULTIPLE COMPONENTS CONNECTED TO A PRINTED CIRCUIT BOARD

(71) Applicant: LENOVO (Singapore) PTE. LTD., New Tech Park (SG)

(72) Inventors: Rodrigo Samper, Raleigh, NC (US); Omar Ali Ali, Morrisville, NC (US); Cory Allen Chapman, Durham, NC (US); Alan Ladd Painter, Cary, NC (US)

(73) Assignee: Lenovo (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 15/082,716

(22) Filed: Mar. 28, 2016

(65) Prior Publication Data
US 2017/0277230 A1   Sep. 28, 2017

(51) Int. Cl.
| | |
|---|---|
| *G06F 1/18* | (2006.01) |
| *G06F 1/16* | (2006.01) |
| *H05K 7/14* | (2006.01) |
| *H01R 12/70* | (2011.01) |
| *H01R 12/72* | (2011.01) |
| *H05K 7/12* | (2006.01) |

(52) U.S. Cl.
CPC ............... *G06F 1/183* (2013.01); *G06F 1/16* (2013.01); *H05K 7/1405* (2013.01); *H05K 7/1417* (2013.01); *G06F 1/185* (2013.01); *H01R 12/7029* (2013.01); *H01R 12/721* (2013.01); *H05K 7/12* (2013.01)

(58) Field of Classification Search
CPC ............ G06F 1/183; G06F 1/185; G06F 1/16; H05K 2201/1059; H05K 2201/10598; H05K 5/0204; H05K 7/1429; H05K 7/12; H05K 7/1417; H05K 7/1405; H05K 7/142; Y10T 292/20; Y10T 292/202; Y10T 292/205; Y10T 292/207; Y10T 292/209; Y10T 292/212; Y10T 292/42; Y10T 292/438; B65D 45/00; B65D 45/16; B65D 45/18; B65D 45/20; B65D 45/22; H01R 12/7029; H01R 12/721
See application file for complete search history.

(56) References Cited

U.S. PATENT DOCUMENTS

| | | | |
|---|---|---|---|
| 5,831,821 A | * | 11/1998 | Scholder ................ G06F 1/184 361/679.32 |
| 6,431,585 B1 | * | 8/2002 | Rickabus .............. B60R 21/215 24/114.05 |

(Continued)

*Primary Examiner* — Dimary Lopez Cruz
*Assistant Examiner* — Abhishek Rathod
(74) *Attorney, Agent, or Firm* — Kunzler, PC

(57) ABSTRACT

Apparatuses, systems, and methods for interfacing with multiple components connected to a printed circuit board. An apparatus includes a plurality of hardware components that each include a first interface. An apparatus includes a printed circuit board that includes a plurality of interfaces that communicatively couple each of the hardware components to the printed circuit board via the first interface. The printed circuit board includes a second interface that communicatively couples the printed circuit board to an information handling device and manages communications between the information handling device and each of the hardware components coupled to the printed circuit board.

14 Claims, 6 Drawing Sheets

(56) References Cited

U.S. PATENT DOCUMENTS

| | | | | |
|---|---|---|---|---|
| 7,101,188 B1* | 9/2006 | Summers | ............ | H01R 12/725 |
| | | | | 439/59 |
| 7,335,032 B1* | 2/2008 | Lee | ............ | G06F 1/185 |
| | | | | 439/76.1 |
| 2005/0285375 A1* | 12/2005 | Kawai | ............ | B60R 21/215 |
| | | | | 280/728.2 |
| 2006/0290155 A1* | 12/2006 | Smith | ............ | B60R 11/00 |
| | | | | 296/29 |
| 2008/0018351 A1* | 1/2008 | Gilliland | ............ | G01R 31/2808 |
| | | | | 324/756.05 |
| 2008/0020621 A1* | 1/2008 | Xiao | ............ | H01R 12/728 |
| | | | | 439/325 |
| 2010/0199464 A1* | 8/2010 | Sano | ............ | B60R 13/02 |
| | | | | 24/289 |
| 2013/0072038 A1* | 3/2013 | Chen | ............ | H05K 7/142 |
| | | | | 439/65 |
| 2013/0294023 A1* | 11/2013 | Gay | ............ | G06F 1/187 |
| | | | | 361/679.31 |
| 2015/0277512 A1* | 10/2015 | Davis | ............ | G06F 1/183 |
| | | | | 361/679.31 |
| 2016/0021777 A1* | 1/2016 | Jimenez, III | ............ | H05K 7/1418 |
| | | | | 361/679.58 |
| 2016/0259754 A1* | 9/2016 | Ping | ............ | G06F 3/0688 |
| 2017/0005422 A1* | 1/2017 | So | ............ | H01R 12/737 |

* cited by examiner

INTERFACING WITH MULTIPLE COMPONENTS CONNECTED TO A PRINTED CIRCUIT BOARD

FIELD

The subject matter disclosed herein relates to computer hardware components and more particularly relates to interfacing with multiple components connected to a printed circuit board.

BACKGROUND

Computing devices may include various components that can be integrated into the device, e.g., are a part of a motherboard, or can be removably connected to the device. A computing device may have a variety of different connection types that can interface with components that have corresponding connection types. In this manner, a user can upgrade, repair, and/or maintain various components of a computing device by adding and/or removing various components such as storage devices, network devices, graphics devices, or the like.

BRIEF SUMMARY

An apparatus for interfacing with multiple components connected to a printed circuit board is disclosed. A method and computer program product also perform the functions of the apparatus. In one embodiment, an apparatus includes a plurality of hardware components that each include a first interface. In certain embodiments, an apparatus includes a printed circuit board that includes a plurality of interfaces that communicatively couple each of the hardware components to the printed circuit board via the first interface. In certain embodiments, a printed circuit board includes a second interface that communicatively couples the printed circuit board to an information handling device and manages communications between the information handling device and each of the hardware components coupled to the printed circuit board.

In one embodiment, an apparatus includes a plurality of fasteners where each fastener secures a hardware component to the printed circuit board. In some embodiments, a fastener of the plurality of fasteners includes an insertion end and a receiving end. In certain embodiments, the insertion end is connected to the receiving end by a flexible member and the receiving end includes a protruding member that is inserted into an opening in the printed circuit board.

In some embodiments, an opening in a hardware component is positioned above the receiving end and the insertion end flexes around the printed circuit board and the hardware component via the flexible member and is inserted into the receiving end through the openings in the hardware component. In certain embodiments, the printed circuit board includes a plurality of openings for fastening hardware components of varying lengths to the printed circuit board.

In some embodiments, an apparatus includes a mounting tray that the printed circuit board is mountable in. In one embodiment, the mounting tray is mountable in a bay of an information handling device such that a printed circuit board is communicatively coupled to the information handling device. In some embodiments, the mounting tray is mountable in a 3.5" bay of the information handling device.

In one embodiment, each of the plurality of hardware components are coupled to the printed circuit board adjacent to one another in a plane substantially parallel to a surface of the printed circuit board. In certain embodiments, the first interface communicatively coupling a hardware component to the printed circuit board comprises an M.2 interface. In some embodiments, the plurality of hardware components coupled to the printed circuit board comprises four M.2 hardware devices.

In one embodiment, the second interface communicatively coupling the printed circuit board to the information handling device comprises a U.2 interface. In a further embodiment, a hardware component of the plurality of hardware components is selected from the group consisting of a solid-state drive, a network interface, and a short-range wireless communication interface.

A system, in one embodiment, includes an information handling device and an apparatus. The apparatus, in one embodiment, includes a plurality of hardware components that each include a first interface. In certain embodiments, an apparatus includes a printed circuit board that includes a plurality of interfaces that communicatively couple each of the hardware components to the printed circuit board via the first interface. In certain embodiments, a printed circuit board includes a second interface that communicatively couples the printed circuit board to an information handling device and manages communications between the information handling device and each of the hardware components coupled to the printed circuit board. In some embodiments, an apparatus includes a plurality of fasteners where each fastener secures a hardware component to the printed circuit board.

In some embodiments, a fastener of the plurality of fasteners includes an insertion end and a receiving end. In certain embodiments, the insertion end is connected to the receiving end by a flexible member and the receiving end includes a protruding member that is inserted into an opening in the printed circuit board. In some embodiments, an opening in a hardware component is positioned above the receiving end and the insertion end flexes around the printed circuit board and the hardware component via the flexible member and is inserted into the receiving end through the openings in the hardware component.

In one embodiment, the system includes a mounting tray that the printed circuit board is mountable in. In one embodiment, the mounting tray is mountable in a bay of an information handling device such that a printed circuit board is communicatively coupled to the information handling device. In some embodiments, the mounting tray is mountable in a 3.5" bay of the information handling device.

In various embodiments, each of the plurality of hardware components are coupled to the printed circuit board adjacent to one another in a plane substantially parallel to a surface of the printed circuit board. In certain embodiments, the first interface communicatively coupling a hardware component to the printed circuit board comprises an M.2 interface. In some embodiments, the plurality of hardware components coupled to the printed circuit board comprises four M.2 hardware devices. In a further embodiment, the second interface communicatively connecting the printed circuit board to the information handling device comprises a U.2 interface.

A method, in one embodiment, includes providing a plurality of hardware components that each include a first interface. A method, in a further embodiment, includes coupling each hardware component to a printed circuit board. In one embodiment, a printed circuit board includes a plurality of interfaces that communicatively couple each of the hardware components to the printed circuit board via the first interface. In certain embodiments, a printed circuit board includes a second interface that communicatively couples the printed circuit board to an information handling device and manages communications between the information handling device and each of the hardware components coupled to the printed circuit board. In one embodiment, the method includes securing each hardware component to the printed circuit board using a plurality of fasteners.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
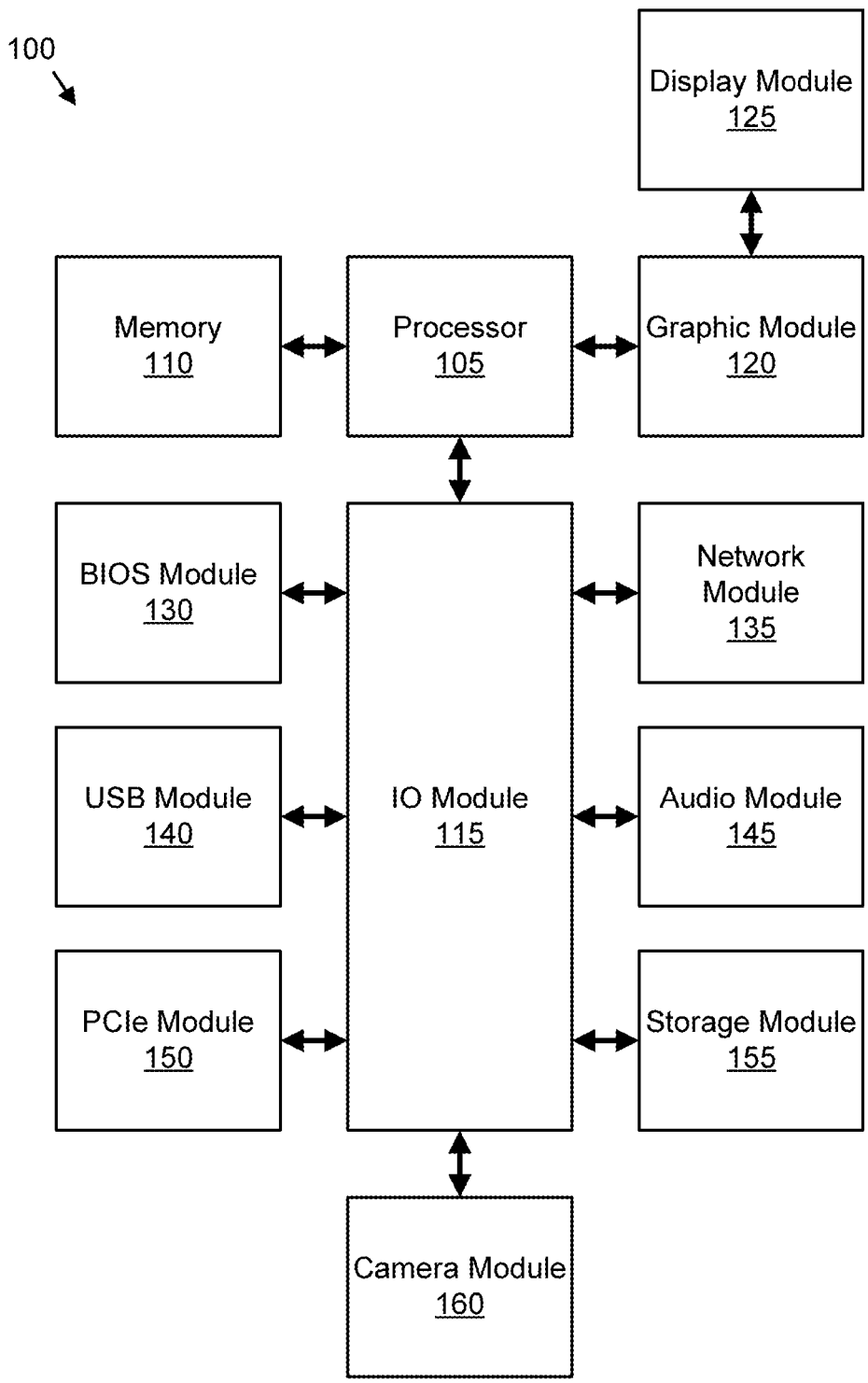
FIG. 1 is a schematic block diagram illustrating one embodiment of an information processing system.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, Java, Smalltalk, C++, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. These code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

FIG. 1 is a schematic block diagram illustrating one embodiment of an information processing system 100. The information processing system 100 includes a processor 105, a memory 110, an IO module 115, a graphics module 120, a display module 125, a basic input/output system ("BIOS") module 130, a network module 135, a universal serial bus ("USB") module 140, an audio module 145, a peripheral component interconnect express ("PCIe") module 150, a storage module 155, and a camera module 160. One of skill in the art will recognize that other configurations of an information processing system 100 or multiple information processing systems 100 may be employed with the embodiments described herein.

The processor 105, memory 110, IO module 115, graphics module 120, display module 125, BIOS module 130, network module 135, USB module 140, audio module 145, PCIe module 150, storage module 155, and/or camera module 160 referred to herein as components, may be fabricated of semiconductor gates on one or more semiconductor substrates. Each semiconductor substrate may be packaged in one or more semiconductor devices mounted on circuit cards. Connections between the components may be through semiconductor metal layers, substrate-to-substrate wiring, circuit card traces, and/or wires connecting the semiconductor devices. In some embodiments, an information processing system may only include a subset of the components 105-160 shown in FIG. 1.

The memory 110 stores computer readable programs. The processor 105 executes the computer readable programs as is well known to those skilled in the art. The computer readable programs may be tangibly stored in the storage module 155. The storage module 155 may comprise at least one Solid State Device ("SSD"). In addition, the storage module 155 may include a hard disk drive, an optical storage device, a holographic storage device, a micromechanical storage device, or the like.

The processor 105 may include integrated cache to reduce the average time to access memory 115. The integrated cache may store copies of instructions and data from the most frequently used memory 110 locations. The processor 105 may communicate with the memory 110 and the graphic module 120.

In addition, the processor 105 may communicate with the IO module 115. The IO module 125 may support and communicate with the BIOS module 130, the network module 135, the PCIe module 150, the storage module 155, and/or the camera module 106.

The PCIe module 150 may communicate with the IO module 115 for transferring/receiving data or powering peripheral devices. The PCIe module 150 may include a PCIe bus for attaching the peripheral devices. The PCIe bus can logically connect several peripheral devices over the same set of connections. The peripherals may be selected from a printer, a joystick, a scanner, a camera, or the like. The PCI module 150 may also comprise an expansion card as is well known to those skilled in the art.

The BIOS module 130 may communicate instructions through the IO module 115 to boot the information processing system 100, so that computer readable software instructions stored on the storage module 155 can load, execute, and assume control of the information processing system 100. Alternatively, the BIOS module 130 may comprise a coded program embedded on a chipset that recognizes and controls various devices that make up the information processing system 100.

The network module 135 may communicate with the IO module 115 to allow the information processing system 100 to communicate with other devices over a network. The devices may include routers, bridges, computers, information processing systems, printers, and the like. The display module 125 may communicate with the graphic module 120 to display information. The display module 125 may include a cathode ray tube ("CRT"), a liquid crystal display ("LCD") monitor, or the like. The USB module 140 may communicate with one or more USB compatible devices over a USB bus. The audio module 145 may generate an audio output.

The camera module 160 may communicate with the IO module 115 for transferring and/or receiving data between the information processing system 100 and a camera. In one embodiment, the camera module 160 may include a camera. In one embodiment, one or more of the other components 105-155 may perform the functions of the camera module 160. For example, a camera device may be USB compatible and/or PCIe compatible and may be connected to the USB module 140 or the PCIe module 150.

Figure 2:
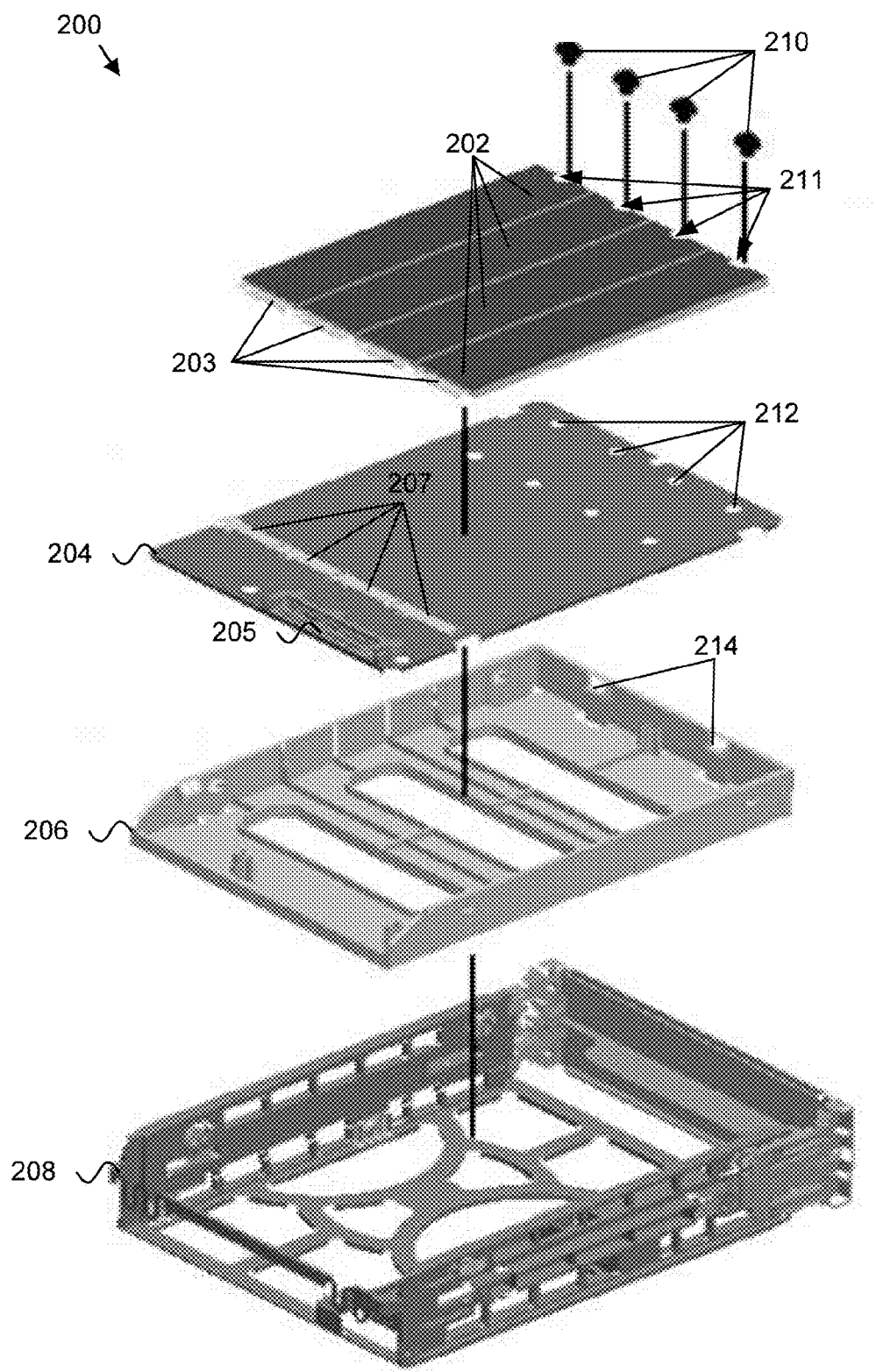
FIG. 2 is an exploded view of one embodiment of a system for interfacing with multiple components connected to a printed circuit board.

FIG. 2 depicts an exploded view of a system 200 for interfacing with multiple components connected to a printed circuit board. In one embodiment, the system 200 includes one or more hardware components 202, a printed circuit board 204, a mounting tray 206, a bracket 208, and one or more fasteners 210, which are described in more detail below.

The one or more hardware components 202, in certain embodiments, include various hardware devices that are connectable to a computer, or more particularly, to a motherboard, backplane, riser card, or the like, or a printed circuit board 204 communicatively connectable to a motherboard, backplane, or riser card (e.g., an expansion card), using a communication/connection interface. For example, the one or more hardware components 202 may include a solid-state drive, a network interface (e.g., a wireless network card, an Ethernet card, or the like), a short-range wireless communication interface (e.g., a Bluetooth® module, a near field communication ("NFC") module, and/or the like), a location services module (e.g., a global positioning system ("GPS") module, or the like), a navigation module, a graphics card, a sound card, a USB card, and/or the like.

In some embodiments, the hardware components 202 include interfaces 203 that communicatively connect to a corresponding interface on a motherboard, a backplane, a printed circuit board 103, an expansion card, and/or the like.

In one embodiment, the interfaces 203 are M.2 interfaces 203. As used herein, an M.2 interface 203, also known as a Next Generation Form Factor ("NGFF") interface, may be an interface for an internally mounted expansion card that interfaces with various communication buses within an information handling device 102 such as PCI Express, Serial ATA, USB, and/or the like.

A hardware component 202 with an M.2 interface connector 203, also known as an M.2 device 202, may have a substantially rectangular form, with the M.2 interface connector 203 located along one or more edges of the hardware component 202. The M.2 device 202 may include a mounting hole on an edge opposite the M.2 connector for mounting the M.2 device to a printed circuit board 103, a motherboard, a backplane, a bracket, and/or the like, as described in more detail below.

An M.2 device may be configured with different widths and lengths. For example, an M.2 solid-state drive may have a width of 30 mm and a length of 60 mm which an M.2 wireless network card may have a width of 22 mm and a length of 42 mm. In some embodiments, M.2 devices 202 may have widths of 12, 16, 22 and 30 mm, and lengths of 16, 26, 30, 38, 42, 60, 80 and 110 mm.

In one embodiment, a hardware component 202 is mounted to a printed circuit board ("PCB") 204 using an interface 203 such as an M.2 interface 203. As used herein, a PCB 204 mechanically supports and electrically connects electronic components using conductive tracks, pads, and/or other features etched from copper sheets laminated onto a non-conductive substrate. The PCB 204, in one embodiment, includes one or more interfaces 207 that correspond to the interfaces 203 on the hardware components 202. For example, the PCB 204 may include one or more M.2 interfaces 207 that are configured to receive an M.2 connector 203 of an M.2 device 202.

In certain embodiments, the PCB 204 is configured with a plurality of interfaces 207 such that a plurality of hardware devices 202 can be connected and mounted to the PCB 204. For example, the PCB 204 may be configured with a plurality of M.2 interfaces 207 that correspond to a plurality of M.2 connectors 203 of a plurality of M.2 devices 202. In certain embodiments, the PCB 204 is configured with four M.2 interfaces 207 such that four different M.2 devices 202 can be connected and mounted to the PCB 204.

In such an embodiment, the PCB 204 may include hardware or electrical circuitry that routes data communications from/to a system interface 205 connecting the PCB 204 to an information handling device 102 to/from each of the M.2 devices 202 connected to the PCB 204. In certain embodiments, the hardware/electrical circuitry also provides power from the information handling device 102 to each of the M.2 devices 202 connected to the PCB 204.

In the depicted embodiment, the hardware components 202 are laid out adjacent to one another on the surface of the PCB 204 along an axis or plane parallel to the surface of the PCB 204. Other arrangements of hardware components 202 may be used. For example, one hardware component 202 may be stacked on top of another hardware component 202, the hardware components may be aligned adjacent to each other on the surface of the PCB 204, but along an axis or plane perpendicular to the surface of the PCB 204, or the like. In certain embodiments, the PCB 204 includes interfaces 207 corresponding to the hardware component interfaces 203 on both surfaces of the PCB 204 such that hardware components 202 may be mounted on both surfaces of the PCB 204.

In certain embodiments, the PCB 204 comprises a plurality of openings 212 that align with openings or notches 211 on the hardware components 202. The openings 212 on the PCB 204 may be at various locations on the PCB 204 to accommodate hardware devices 202 of various lengths or hardware devices 202 that have various configurations of openings 211.

In one embodiment, the PCB 204 includes a system interface 205 that communicatively connects the PCB 204 to an information handling device 102. The system interface 205 may be configured to connect directly to a corresponding interface on a motherboard, a backplane, or the like of an information handling device 102. For example, the system interface 205 may communicatively couple directly to a corresponding interface on a server's motherboard. In a further embodiment, the system interface 205 may be configured communicatively couple to an information handling device 102 using a cable where one end of the cable is connected to a motherboard or backplane of the information handling device 102 and the other end of the cable is connected to the system interface 205.

In certain embodiments, the system interface 205 is a U.2 interface 205. As used herein, a U.2 interface 205, also known as a SFF-8639 interface, may be an interface connector for communicatively coupling a PCB 204, such as an expansion card, to a motherboard, backplane, or the like and that interfaces with various communication buses within an information handling device 102 such as PCI Express, Serial ATA, USB, and/or the like. The U.2 interface 205, in one embodiment, supports a plurality of data communication lanes for transmitting data between an information handling device 102 and a plurality of hardware components 202 connected to the PCB 204.

For example, the U.2 interface 205 may support four data communication lanes (e.g., four PCI Express lanes, four SATA lanes, or the like) for transmitting data between each of four M.2 devices 202 communicatively coupled to the PCB 204 using an M.2 interface 203. In some embodiments, with the combination of the M.2 interfaces 203 and the U.2 interface 205, the PCB 204 can repurpose four PCI Express data lanes through the U.2 interface 205 to be compatible with four M.2 devices 202 communicatively coupled to the PCB 204 using M.2 interfaces 203.

In one embodiment, the PCB 204 is sized to be inserted and mounted to a mounting tray 206. The mounting tray 206, in one embodiment, is mountable in a drive bay of an information handling device 102. For example, the mounting tray may be sized to fit in a 3.5" drive bay in a desktop computer. In such an embodiment, the PCB 204, when mounted to the mounting tray 206, is communicatively coupled to an information handling device 102 when the mounting tray 206 is installed in the information handling device 102. As described above, the PCB 204 may be communicatively coupled to an information handling device using the U.2 interface 205 by directly connecting the U.2 interface 205 to a motherboard or backplane, or by connecting a cable to the U.2 interface 205 where the other end of the cable is connected to the motherboard or backplane.

Figure 3:
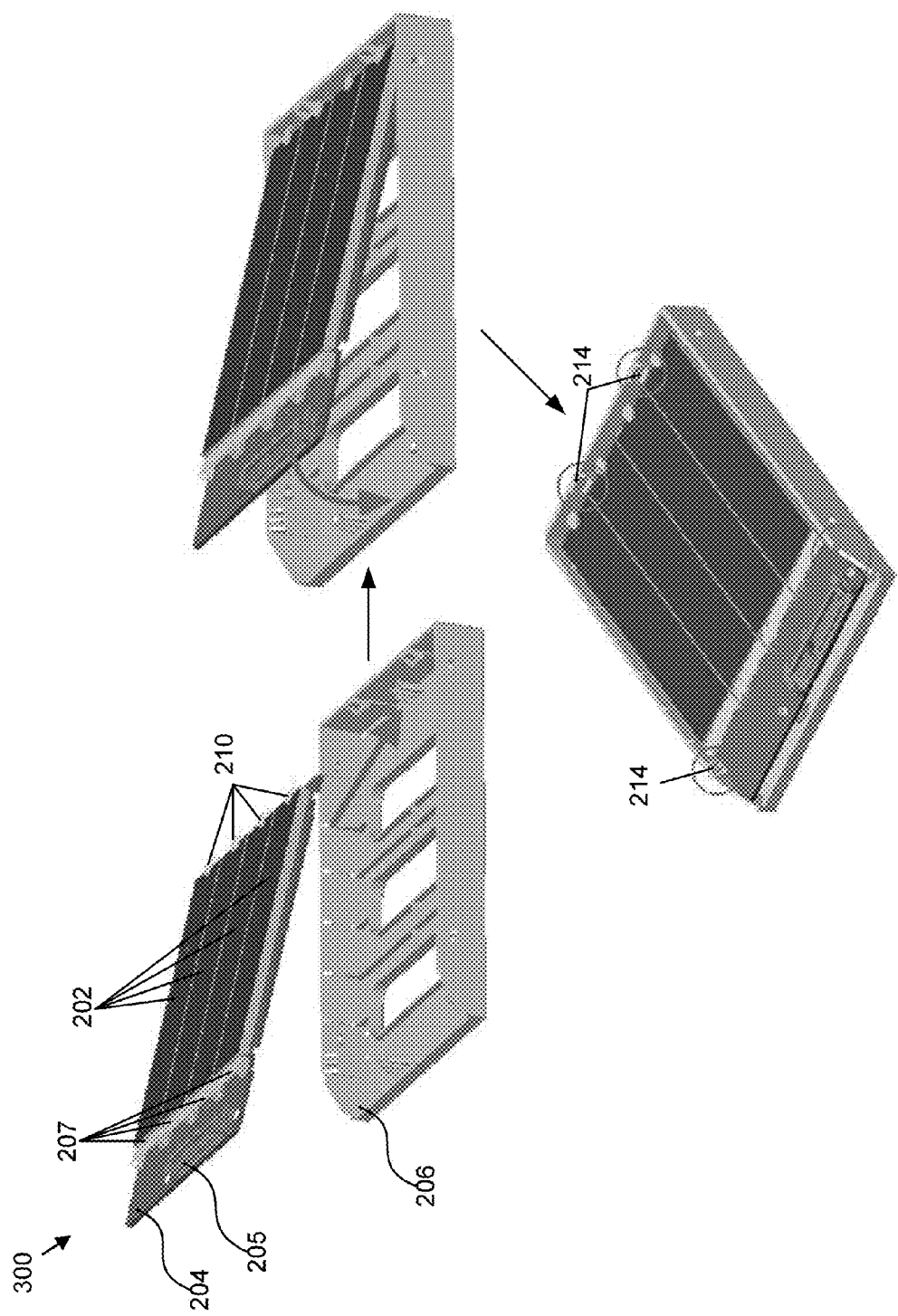
FIG. 3 is a perspective view of one embodiment of a system for interfacing with multiple components connected to a printed circuit board.

In one embodiment, the mounting tray 206 is made of a non-conductive material, such as plastic, polycarbonate, or the like. The mounting tray 206 may include one or more securing mechanisms 214 for securing the PCB 204 to the mounting tray 206. For example, referring now to FIG. 3, FIG. 3 depicts one embodiment 300 of installing a PCB 204 into a mounting tray 206. In one embodiment, the PCB 204, with the mounted M.2 devices 202, may be inserted or slid into the mounting tray 206 such that a first end of the PCB 204 is inserted into the mounting tray 206 underneath one or more clips 214. Next, the PCB 204 is forced downward at a second end to secure the second end of the PCB 204 underneath one or more other clips 214 of the mounting tray 206. Other fastening mechanisms may include screws, adhesives, snaps, a friction fit, and/or the like.

In certain embodiments, referring now to FIG. 1, the mounting tray 206 may be secured in a mounting bracket 208, such as a hard drive bracket, or the like. The mounting tray 206 may be secured to the mounting bracket 208 using screws, adhesives, clips, a snap fit, a friction fit, and/or other fasteners. The mounting bracket 208 may be removably coupled to a drive bay in a computer. For example, the mounting bracket 208 may be similar to a mounting bracket for a 3.5" laptop hard drive. Thus, the mounting bracket 208 may provide another means for the PCB 204, including the hardware components 202, to be installed and coupled to an information handling device 102 using the mounting tray 206.

Figure 4:
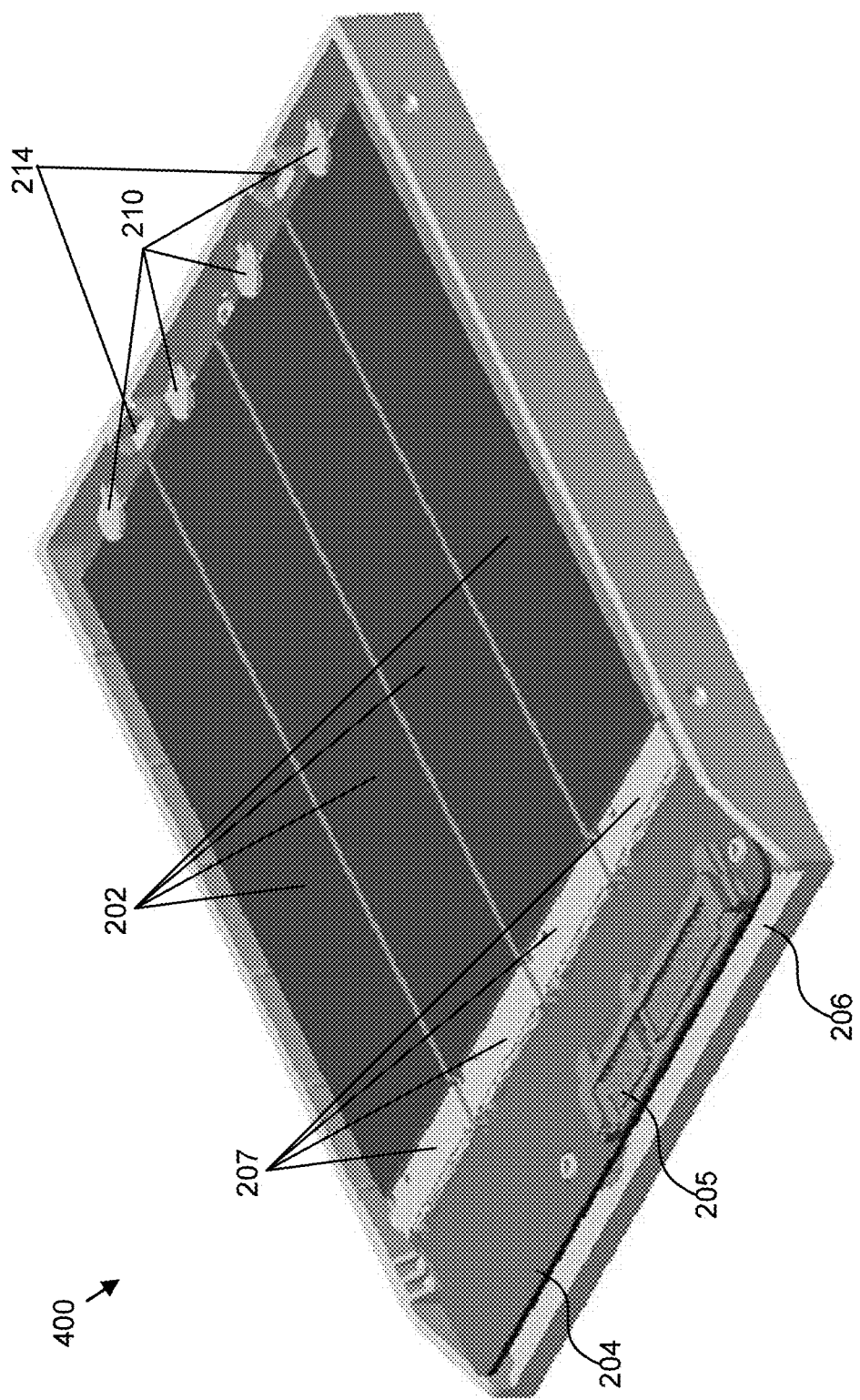
FIG. 4 is a perspective view of another embodiment of a system for interfacing with multiple components connected to a printed circuit board.

Referring now to FIG. 4, FIG. 4 depicts one embodiment 400 of a PCB 204, with a plurality of hardware components 202 coupled to the PCB 204, installed in a carrier tray 206. In the depicted embodiment 400, the carrier tray may have a 3.5" form factor such that it can fit into a drive bay of an information handling device 102. In such an embodiment, the system connector 205, e.g., the U.2 interface 205, on the PCB 204 is communicatively coupled, either directly or using a cable, to a motherboard or backplane of the information handling device 102. Accordingly, data may be transmitted to/from the information handling device 102 from/to the hardware components 202, e.g., the M.2 devices 202, via the U.2 interface 205, which manages the data transmissions between the M.2 devices 202 and the information handling device 102.

Referring now to FIG. 2, the system 200 includes one or more fasteners 210 configured to fasten the hardware components 202 to the PCB 204. As described above, the PCB 204 may include a plurality of openings 212 that correspond to one or more openings or notches 211 in the hardware components 202. In some embodiments, the fasteners 210 may be screws, pins, adhesive mechanisms, and/or the like. In one embodiment, the fasteners 210 may comprise flexible, tool-less fasteners 210 as depicted in FIGS. 5A and 5B.

Figure 5A:
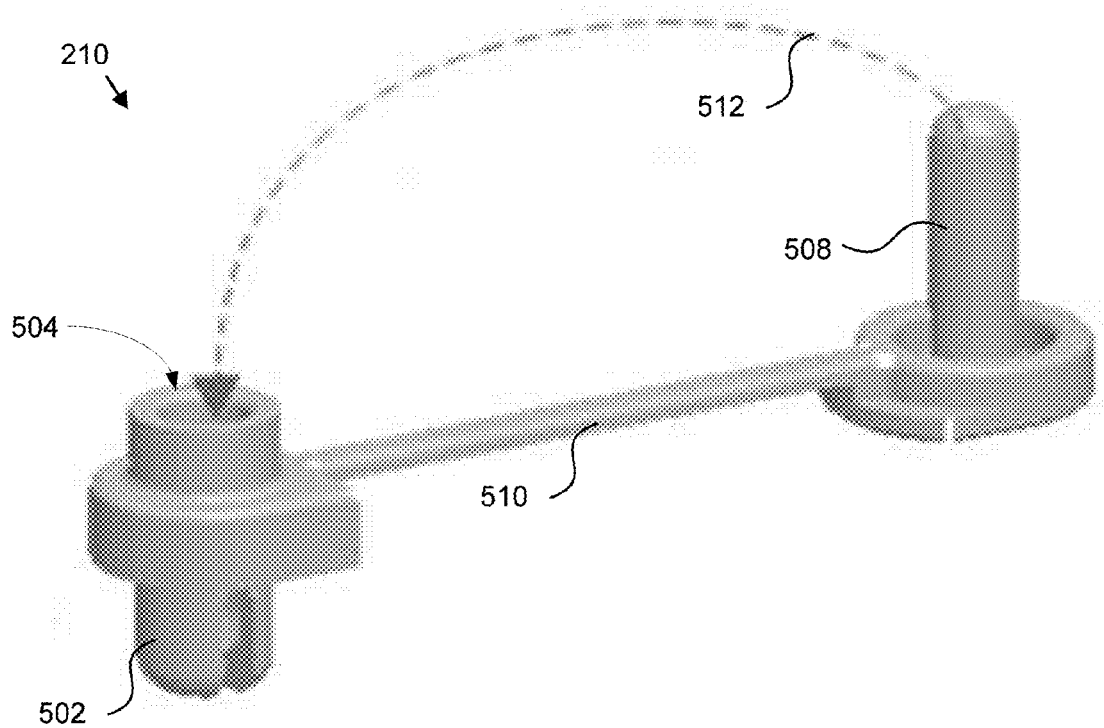
FIG. 5A is a perspective view of one embodiment of a fastener used in a system for interfacing with multiple components connected to a printed circuit board.

Referring now to FIG. 5A, FIG. 5A depicts one embodiment of a flexible, tool-less fastener 210. The fastener 210 may be referred to as a plunger fastener 210. The plunger fastener 210 may be made of a flexible, but rigid material, such as rubber, plastic, polycarbonate, and/or the like. In one embodiment, the plunger fastener 210 includes an insertion end 508 and a receiving end 504. In such an embodiment, the insertion end 508 is connected to the receiving end 504 by a flexible member 510. The receiving end 504, in some embodiments, includes a protruding member 502 that is inserted into an opening 212 in the PCB 204. The receiving end 504, in some embodiments, is placed beneath an opening or notch 211 in a hardware component 202 while the insertion end 508 flexes around an edge of the hardware component 202 and inserts into the receiving end 504 to secure the hardware component 202 between the insertion end 508 and the receiving end 504. The protruding member 502 is then inserted into an opening 212 in the PCB 204 to secure one end of the hardware component 202 to the PCB 204 while the other end of the hardware component 202 comprising the interface 203, e.g., the M.2 interface 203, is inserted into a corresponding interface 207 in the PCB 204.

Figure 5B:
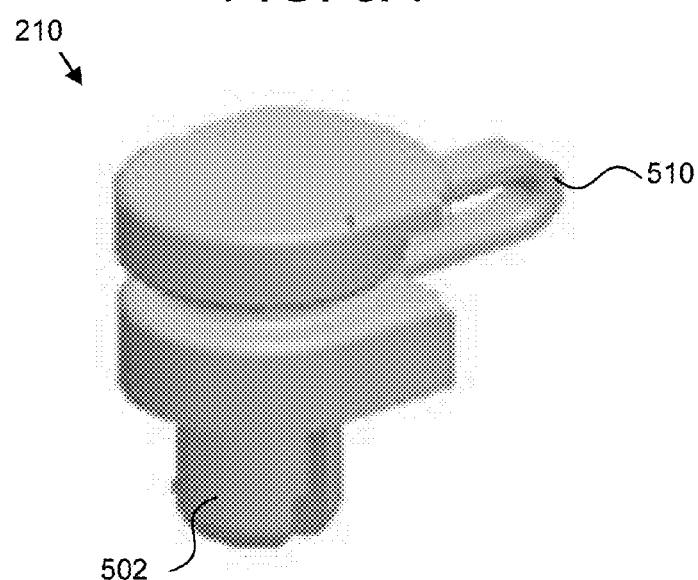
FIG. 5B is a perspective view of another embodiment of a fastener used in a system for interfacing with multiple components connected to a printed circuit board.

FIG. 5B depicts an embodiment of the fastener 210 in a closed position. After the hardware component 202 is placed between the insertion end 508 and the receiving end 504, the fastener 210 may be inserted into an opening 212 in a PCB 204 to secure the hardware component 202 to the PCB 204. The flexible member 510 may have various sizes to accommodate hardware components 202 of various lengths, various configurations of openings 211 in the hardware components, various configurations of openings 212 in a PCB 204, and/or the like.

Figure 6:
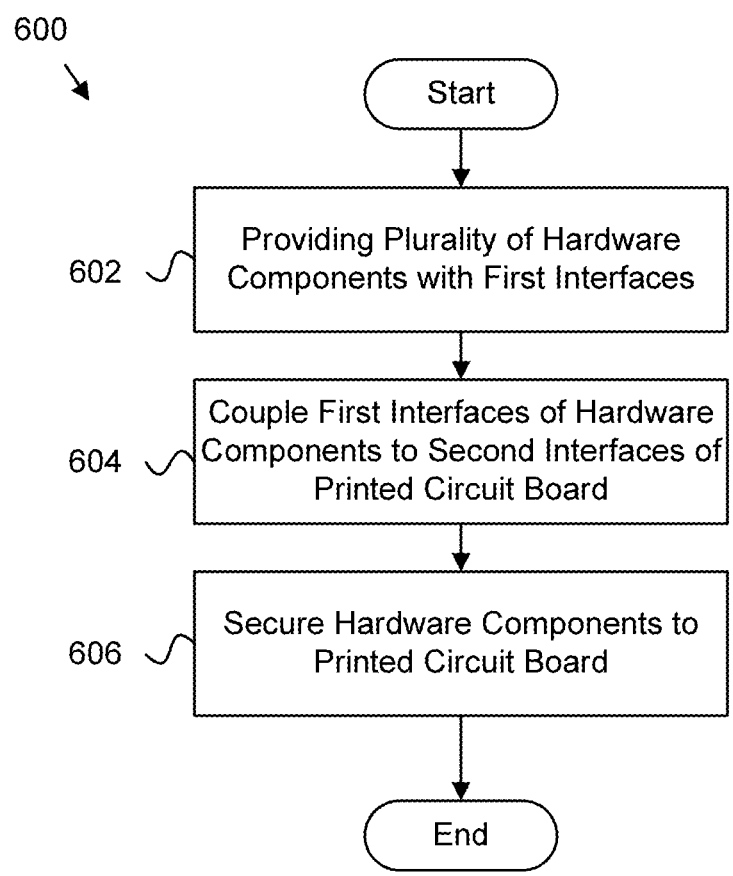
FIG. 6 is a schematic flow chart diagram illustrating one embodiment of a method for interfacing with multiple components connected to a printed circuit board.

FIG. 6 depicts one embodiment of a method 600 for interfacing with multiple components 202 connected to a printed circuit board 204. In one embodiment, the method 600 begins and provides 602 a plurality of hardware components 202. In some embodiments, each hardware component 202 includes a first interface 203, e.g., an M.2 interface 203. In a further embodiment, the method 600 couples 604 each hardware component 202 to a PCB 204 that includes a plurality of interfaces 207 that communicatively couple each of the hardware components 202 to the PCB 204 via the first interface 203.

In some embodiments, the PCB 204 includes a second interface 205, e.g., a U.2 interface 205, that communicatively couples the PCB 204 to an information handling device 102 and manages communications between the information handling device 102 and each of the hardware components 202 coupled to the PCB 204. In a further embodiment, the method 600 secures 606 each hardware component 202 to the PCB using a plurality of fasteners 210, and the method 600 ends.

Embodiments may be practiced in other specific forms. The described embodiments are to be considered in all respects only as illustrative and not restrictive. The scope of the subject matter disclosed herein is, therefore, indicated by the appended claims rather than by the foregoing description. All changes which come within the meaning and range of equivalency of the claims are to be embraced within their scope.

What is claimed is:

1. An apparatus comprising:
a printed circuit board, the printed circuit board comprising:
three or more first interfaces, the three or more first interfaces arranged adjacent to one another in a plane substantially parallel to a surface of the printed circuit board and configured to communicatively couple hardware components to the printed circuit board; and
a second interface that communicatively couples the printed circuit board to a motherboard of an information handling device, the second interface managing communications between the motherboard of the information handling device and the hardware components coupled to the printed circuit board;
a plurality of openings configured to receive one or more fasteners for securing the hardware components to the printed circuit board, the plurality of openings located at various positions on the printed circuit board to accommodate hardware components that have various configurations of openings; and
one or more fasteners for securing the hardware components to the printed circuit board, the one or more fasteners comprising an insertion end and a receiving end, the insertion end connected to the receiving end by a flexible member, the receiving end comprising a protruding member that is inserted into an opening in the printed circuit board, the insertion end flexing around the hardware component via the flexible member and inserted into the receiving end through an opening in the hardware component, the opening of the hardware component positioned above the receiving end of the fastener.

2. The apparatus of claim 1, further comprising a mounting tray, the printed circuit board mountable in the mounting tray, the mounting tray mountable in a bay of the information handling device such that the printed circuit board is communicatively coupled to the information handling device.

3. The apparatus of claim 2, wherein the mounting tray is mountable in a 3.5" bay of the information handling device.

4. The apparatus of claim 1, wherein the three or more first interfaces communicatively coupling hardware components to the printed circuit board comprise M.2 interfaces.

5. The apparatus of claim 4, wherein the hardware components coupled to the printed circuit board comprise M.2 hardware devices.

6. The apparatus of claim 1, wherein the second interface communicatively coupling the printed circuit board to the information handling device comprises a U.2 interface.

7. The apparatus of claim 1, wherein the hardware components are selected from the group consisting of:
a solid-state drive;
a network interface; and
a short-range wireless communication interface.

8. A system comprising:
an information handling device;
an apparatus comprising:
a printed circuit board, the printed circuit board comprising:
three or more first interfaces, the three or more first interfaces arranged adjacent to one another in a plane substantially parallel to a surface of the printed circuit board and configured to communicatively couple hardware components to the printed circuit board;
a second interface that communicatively couples the printed circuit board to a motherboard of an information handling device, the second interface managing communications between the motherboard of the information handling device and the hardware components coupled to the printed circuit board; and
a plurality of openings configured to receive one or more fasteners for securing the hardware components to the printed circuit board, the plurality of openings located at various positions on the printed circuit board to accommodate hardware components that have various configurations of openings; and
a plurality of fasteners, the plurality of fasteners securing the hardware components to the printed circuit board, the plurality of fasteners comprising an insertion end and a receiving end, the insertion end connected to the receiving end by a flexible member, the receiving end comprising a protruding member that is inserted into an opening in the printed circuit board, the insertion end flexing around the hardware component via the flexible member and inserted into the receiving end through an opening in the hardware component, the opening of the hardware component positioned above the receiving end of the fastener.

9. The system of claim 8, further comprising a mounting tray, the printed circuit board mountable in the mounting tray, the mounting tray mountable in a bay of the information handling device such that the printed circuit board is communicatively coupled to the information handling device.

10. The system of claim 9, wherein the mounting tray is mountable in a 3.5" bay of the information handling device.

11. The system of claim 8, wherein the three or more first interfaces communicatively coupling hardware components to the printed circuit board comprise M.2 interfaces.

12. The system of claim 8, wherein the hardware components coupled to the printed circuit board comprise M.2 hardware devices.

13. The system of claim 8, wherein the second interface communicatively connecting the printed circuit board to the information handling device comprises a U.2 interface.

14. A method comprising:
providing a printed circuit board, the printed circuit board comprising:
three or more first interfaces, the three or more first interfaces arranged adjacent to one another in a plane substantially parallel to a surface of the printed circuit board and configured to communicatively couple hardware components to the printed circuit board;
a second interface that communicatively couples the printed circuit board to a motherboard of an information handling device, the second interface managing communications between the motherboard of the information handling device and the hardware components coupled to the printed circuit board; and
a plurality of openings configured to receive one or more fasteners for securing the hardware components to the printed circuit board, the plurality of openings located at various positions on the printed circuit board to accommodate hardware components that have various configurations of openings;
coupling the hardware components to the printed circuit board at the first interface; and
securing the hardware components to the printed circuit board using a plurality of fasteners, the plurality of fasteners comprising an insertion end and a receiving end, the insertion end connected to the receiving end by a flexible member, the receiving end comprising a protruding member that is inserted into an opening in the printed circuit board, the insertion end flexing around the hardware component via the flexible member and inserted into the receiving end through an opening in the hardware component, the opening of the hardware component positioned above the receiving end of the fastener.

* * * * *